United States Patent [19]

Kuriyama

[11] 4,221,652
[45] Sep. 9, 1980

[54] SPUTTERING DEVICE
[75] Inventor: Noboru Kuriyama, Kawasaki, Japan
[73] Assignee: Kabushiki Kaisha Tokuda Seisakusho, Kawasaki, Japan
[21] Appl. No.: 674,220
[22] Filed: Apr. 6, 1976
[30] Foreign Application Priority Data
Apr. 10, 1975 [JP] Japan .................................. 50/43520
[51] Int. Cl.$^2$ ............................................. C23C 15/00
[52] U.S. Cl. ................................ 204/298; 204/192 R
[58] Field of Search ................................ 204/192, 298
[56] References Cited
U.S. PATENT DOCUMENTS

| | | | |
|---|---|---|---|
| 3,354,074 | 11/1967 | Kay ........................................ | 204/298 |
| 3,393,142 | 7/1968 | Moseson ................................ | 204/298 |
| 3,652,443 | 3/1972 | Fish et al. ............................. | 204/298 |
| 3,884,793 | 5/1975 | Penfold et al. ........................ | 204/298 |

Primary Examiner—Aaron Weisstuch
Attorney, Agent, or Firm—Koda and Androlia

[57] ABSTRACT

The sputtering device disclosed herein is based on the fact that the lower the pressure of a gas atmosphere in which glow discharge is effected the smaller the number of chances for metallic atoms emitted from a target or cathode by sputtering to collide with residual molecules between the electrodes is, and the finer the finish of a metallic film formed by depositing the metallic atoms arriving directly to a workpiece is. Also, if the energy of electrons emitted from the target is reduced upon arrival at the anode, the temperature rise inside of the device and especially that of the workpiece can be minimized.

The target and the anode are provided in the form of coaxial cylinders, and a magnet is disposed in the target in such a manner that the direction of the magnetic field orthogonally crosses that of the electric field, so that the electro-magnetic force encloses the electrons in an electrode space to increase the density of electrons therein, whereby sputtering is effectively carried out even in a gas atmosphere of extremely low pressure and direct collision of the electrons with the anode is prevented, thereby minimizing the temperature rise of the workpiece.

16 Claims, 9 Drawing Figures

SPUTTERING DEVICE

BACKGROUND OF THE INVENTION

This invention relates to sputtering devices which deposit a metallic film on the surface of a workpiece by the utilization of a cathode sputtering phenomenon which occurs in a glow discharge.

In general, in sputtering devices, the cathode sputtering phenomenon accompanying glow discharge, that is, the phenomenon that the material of a cathode is vaporized into metallic atoms or a mass of metallic atoms by the bombardment of gas ions thereto, a part of the atoms being scattered, is utilized. The metallic atoms thus scattered are adhered to the surface of a workpiece positioned in the vicinity of the anode thereby to form a metallic film thereon.

A feature of such sputtering is that the lower the pressure of the gas atmosphere in which the sputtering is effected, the smaller the number of chances for the metallic atoms emitted from the cathode to collide with the residual molecules between the electrodes is, and at the same time the finer the finish of a metallic film obtained by depositing the metallic atoms arriving directly at the workpiece is. That is, the pressure of the gas atmosphere should be as low as possible to improve the quality of the metallic film deposited on the work piece.

In conventional sputtering devices of this type, conditions for effectively conducting sputtering in a glow discharge are experimentally determined by the nature and state of the gas and the cathode material employed therein, and especially the pressure of the gas, which must be maintained at a certain value (of the order of $1-2 \times 10^{-2}$ Torr in direct current glow discharge, in general) for the occurrence of a glow discharge. Thus, lowering the pressure of the gas is limited.

Furthermore, in conventional sputtering devices, electrons emitted from the target during the sputtering collide with the anode thereby increasing the temperature of the latter. The temperature of the workpiece placed near the anode is also increased by the radiant heat from the anode. Therefore, the heat stability of the workpiece must be taken into consideration.

SUMMARY OF THE INVENTION

Accordingly, a primary object of this invention is to provide a sputtering device in which the direction of a magnetic field orthogonally crosses that of an electric field. A magnet is disposed within the target so that the magnetic force lines of the magnet start from the surface of the target and return to the same in an electrode space (defined later), and sputtering is effectively performed under electromagnetic action even in a gas atmosphere of extremely low pressure.

Another object of the invention is to provide a sputtering device in which a target is uniformly sputtered, and therefore the distribution in thickness of a metallic film deposited on a workpiece is uniform.

A further object of the invention is to provide a sputtering device which provides excellent cooling in order to carry out sputtering at low temperature.

A still further object of the invention is to provide a sputtering device in which the structure of the permanent magnet is simple and the handling of the same is also simple so that no difficulties are caused during sputtering.

The specific feature of the sputtering device according to this invention resides in that cylindrical cathode and anode electrodes are coaxially disposed and a magnetic field is generated orthogonal with the electric field thereby controlling the drift motion of electrons so that they do not reach the anode unless they lose their energy upon colliding with gas molecules. In order to cause the drift motion of the electrons to occur in a particular region, one or a plurality of magnets having a radial magnetic field are disposed in parallel to the target or cathode (perpendicularly to the electric field).

The sputtering device thus described has the following merits:

(1) Formation of a metallic film on a workpiece can be achieved in a high vacuum (less than $2-3 \times 10^{-4}$ Torr in direct current discharge).

(2) The amount of the temperature rise of the workpiece is less. It is said that a main cause of the temperature rise of the workpiece is the flow of electrons into the anode (which sometimes serves as a base plate).

(3) Deposition rate is high. Since the temperature rise of the workpiece is less, as was described above, a large electric power can be applied to the sputtering device, and therefore a high deposition rate can be obtained.

(4) The structure of the target is simple:

(a) Since the electric discharge is effected in a high vacuum, insulation for the target can be simple. Thus, it is unnecessary to provide a dark space shield, or the like.

(b) The discharge is effected only at places where the electric and magnetic fields are crossed orthogonal 14. Therefore, the cathode is covered with a deposition material only at the portions where the discharge is effected.

(5) Cooling of the electrodes can be readily achieved.

(a) The cathode can be cooled with water by the conventional water-cooling method if a permanent magnet is employed.

(b) One or several rods disposed in parallel to the cathode and perpendicularly to the direction of the drift motion of the electrons can be used as anodes. If these anodes are replaced by pipe-shaped anodes, they can be readily cooled with water. Furthermore, since the energy of the electrons is small when they have reached the anodes, the amount of water necessary for cooling the anode can be relatively small.

The nature, principle and utility of this invention will become more apparent from the following detailed description and the appended claims when read in conjunction with the accompanying drawings in which like parts are designated by like reference characters.

DETAILED DESCRIPTION OF THE INVENTION

Figure 1A:
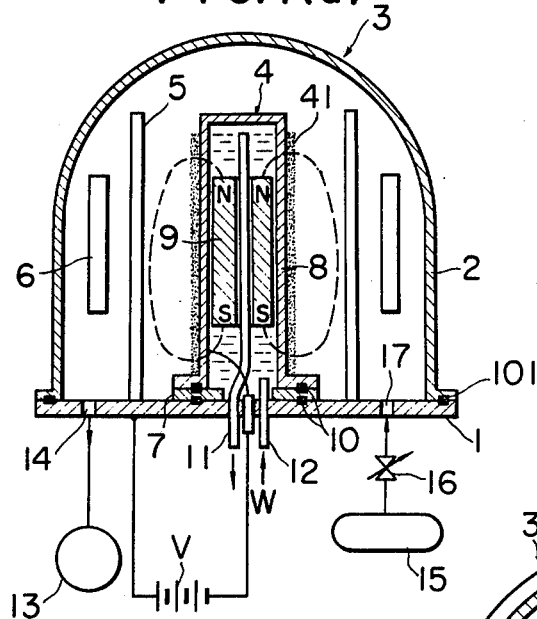
FIGS. 1(a) and 1(b) are respectively a vertical sectional view and a horizontal sectional view illustrating a first example of a sputtering device according to this invention.
Figure 1B:
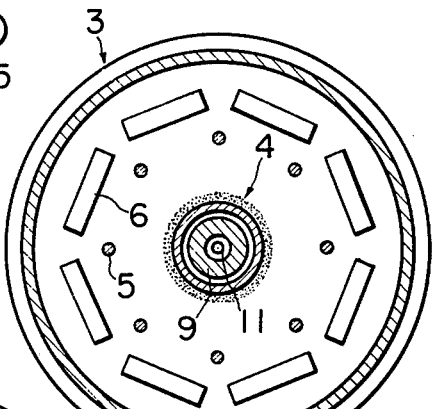

A first example of a sputtering device, as shown in FIGS. 1(a) and 1(b), comprises a base plate 1 and a cylindrical cover 2 which is hermetically and detachably mounted on the base plate 1 by the use of packing 101, to provide a vacuum container 3. In this container 3 there are coaxially provided a target (or cathode) 4, anodes 5, and workpieces 6.

The target 4 is obtained by plating or spraying with target material 41 such as chrome (Cr) the outer surface of cylinder 8 of non-magnetic material which is mounted through an insulator 7 on the central portion of the base plate 1, or by winding a wire or strip of target material 41 such as molybdenum (Mo) or tungsten (W) around the cylinder 8. If the cylinder 8 is made of material such as aluminum (Al), copper (Cu) or stainless steel (SUS), no treatment such as described above is necessary, that is, it can be used, as it is, as the target 4.

In this example, the anodes 5 are rod-shaped electrodes provided on the base plate 1. The rod-shaped electrodes 5 are disposed in such a manner that they surround the target 4. Furthermore, the workpieces 6 are placed in such a manner that they surround the electrodes 5.

In the cylinder 8, there is provided a cylindrical magnet 9 having a through-hole along its axis in such a manner that the direction of the magnetic field H of the magnet 9 crosses orthogonally the direction of the electric field E between the electrodes 4 and 5.

Packings 10 are provided between the base plate 1 and the insulator 7, and between the insulator 7 and the bottom of the cylinder 8 so that the inside of the cylinder is maintained airtight. A cooling-water inlet pipe 12 for introducing cooling water W into the cylinder 8 and a cooling water outlet pipe 11 for discharging the cooling water W out of the cylinder 8, as shown in FIG. 1(a), penetrate into the cylinder 8 through the base plate 1, the outlet pipe 11 extending through the through-hole of the magnet 9 so that the cooling water is circulated in the cylinder 8 so as to cool the target 4 whose temperature is increased by bombardment of gas ions.

Furthermore, in the base plate 1 there are provided an air suction port 14 to which a vacuum pump 13 is connected, and a gas injection port 17 to which a gas cylinder 15 is connected through a control valve 16.

The operation of the sputtering device thus described will bow be described.

First, the vacuum pump 13 is operated to evacuate the vacuum container 3. Then, the vacuum container 3 is filled with the gas from the gas cylinder 15; however, the gas in the vacuum container 3 is maintained at a predetermined pressure at all times by adjusting the control valve 16 of the gas cylinder 15.

If, under this condition, a suitable exciting voltage V is applied across the target 4 and the anodes 5 to provide a glow discharge therebetween, the cathode sputtering phenomenon described before takes place, that is, the target atoms sputtered are deposited on and adhered to the surfaces of the workpieces 6, thus forming a film on the workpiece which has strongly adhered thereto.

In this operation, the magnetic field H of the magnet 9 causes a force F along the electrodes 4 and 5 provided in the form of coaxial cylinders to act on the electrons which have been emitted from the target 4 by the bombardment of the gas ions, as a result of which the electrons are enclosed in a space defined by the electric field formed by the electrodes 4 and 5 and the magnetic field of the magnet 9 (hereinafter referred to as "electrode space" when applicable), and are moved along the electrodes. Accordingly, the density of the electrons in the electrode space is increased, and therefore the glow discharge becomes vigorous and sputtering is effected more actively.

Thus, even if the pressure in the vacuum container 3 is reduced from $1 \times 10^{-2}$ Torr to a value of the order of $1 \times 10^{-4}$, sputtering can be carried out at high efficiency. Furthermore, in the sputtering device according to the invention, the number of electrons (emitted by the cathode) which collide with the workpieces is considerably reduced, and the temperature rise of the workpieces is also considerably reduced.

Figure 2A:
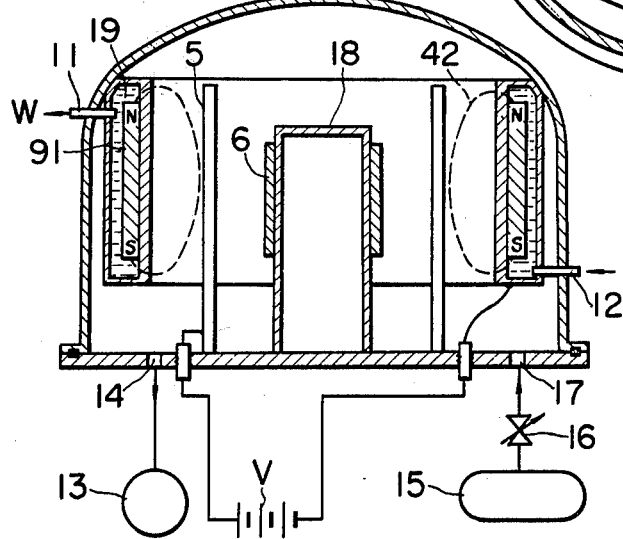
FIGS. 2(a) and 2(b) are respectively a vertical sectional view and a horizontal sectional view illustrating a second example of the sputtering device according to the invention.
Figure 2B:
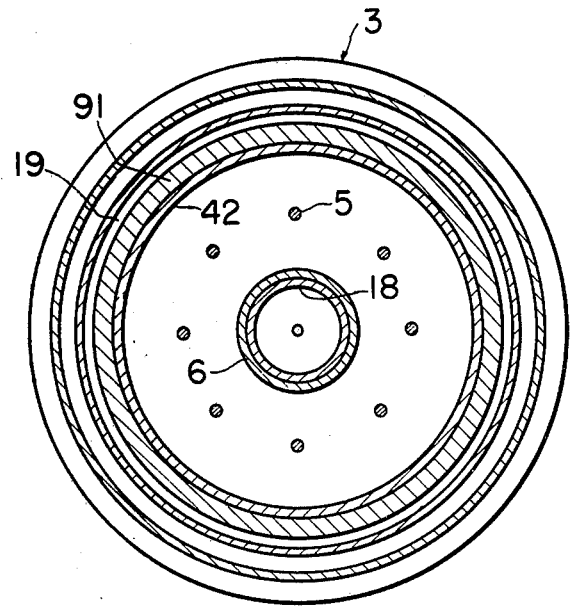

A second example of a sputtering device according to this invention is shown in FIGS. 2(a) and 2(b). Its operating principle is completely the same as that of the first example described above.

In the second example, a workpiece holder 18 is provided at the central portion of a vacuum container 3 made of non-magnetic insulating material, and a target 42 and a hollow cylindrical magnet 91 (both being cylindrical) surround the workpiece holder 18. More specifically, the target 42 has outer and inner walls forming a cylindrical chamber 19 in which the magnet 91 is disposed and cooling water W is circulated through inlet and outlet pipes 12 and 11.

A workpiece 6 is placed on the workpiece holder 18 as is shown in FIGS. 2(a) and 2(b). Since in this case the surface of the target 42 is larger in area than that of the workpiece, the rate of growth of a metallic film on the workpiece is quicker. This is one of the merits of the second example.

Thus, the sputtering devices according to this invention are advantageous in that the sputtering can be achieved at high efficiency even in a gas atmosphere of extremely low pressure, and a fine metallic film is therefore deposited on a workpiece. In addition, the sputtering devices according to this invention provide good cooling, and therefore it is possible to form a metallic film even on materials, such as paper and synthetic resin, which are low in thermal stability.

In the examples described above, the direct current sputtering method is employed; however, it should be noted that the invention is not limited thereto or thereby. That is, the RF sputtering method using a high-frequency electric source can be employed in the examples.

Figure 3:
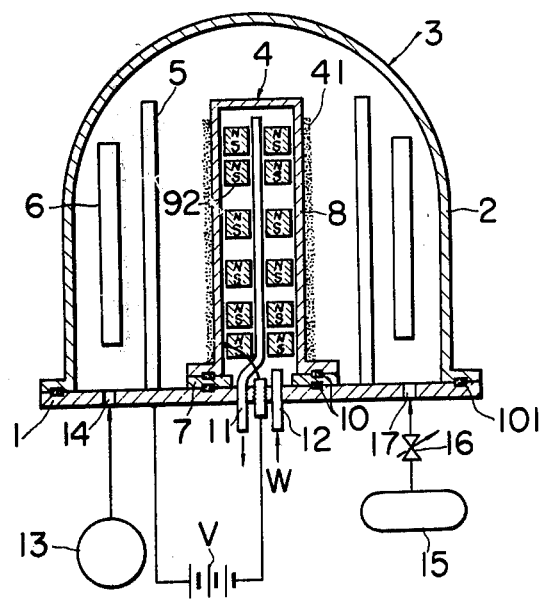
FIG. 3 is a vertical sectional view showing a third example of the sputtering device according to the invention.

A third example of a sputtering device according to this invention, as shown in FIG. 3, is similar to the first example except that a plurality of small magnets 92 are disposed in the target 4 so that the distribution in thickness of a metallic film deposited on a workpiece 6 is uniform.

Figure 4:
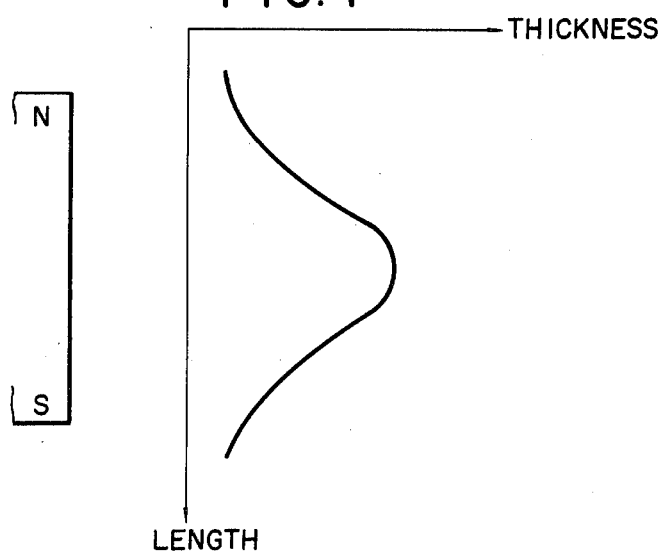
FIG. 4 is a graphical representation indicating the distribution in thickness of a metallic film deposited on a workpiece by the sputtering device shown in FIGS. 1(a) and 1(b)
Figure 5:
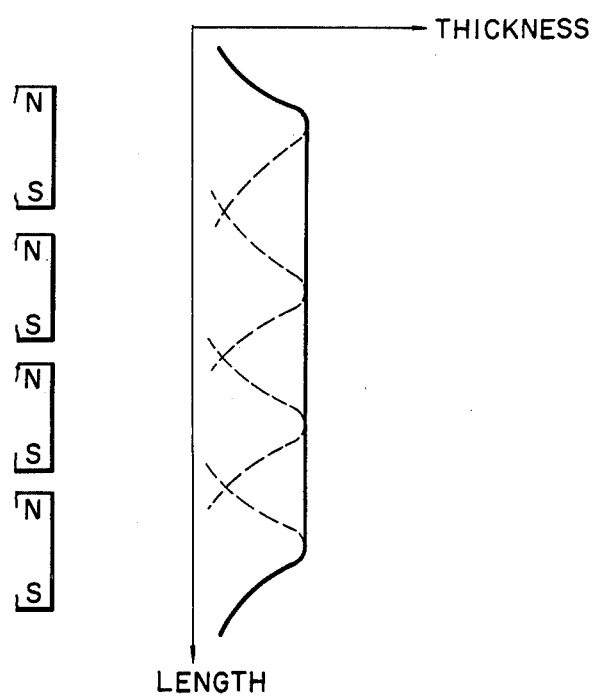
FIG. 5 is also a graphical representation indicating the distribution in thickness of a metallic film deposited on a workpiece by the sputtering device shown in FIG. 3.

In the sputtering device having a cylindrical magnet such as that shown in FIGS. 1(a) and 1(b), only the part of the target 4 where the magnet 9 is provided is the sputtering source. Therefore, the thickness of a metallic film is uneven as is shown in FIG. 4. This has been known through several experiments.

In order to overcome this difficulty accompanying the first example, the single cylindrical magnet 9 shown in FIGS. 1(*a*) and 1(*b*) is divided into a plurality of cylindrical magnets 92, that is, a plurality of sputtering sources are formed so that the distribution of metallic atoms emitted by sputtering is uniform throughout the target material.

The third example is similar in construction and operation to the first example shown in FIGS. 1(*a*) and 1(*b*). However, the magnets 92 are spaced at suitable intervals along the target material 41. More specifically, the magnets 92 provided at the top and the bottom portion of the target material are spaced at relatively short intervals and at the same time the magnets provided at the middle portion thereof are spaced at relatively long intervals so that the distribution of metallic atoms emitted by sputtering is uniform throughout the target material, that is, the density of the metallic atoms emitted in the electrode space is uniform. Accordingly, the distribution in thickness of a metallic film deposited on a workpiece 6 becomes uniform, too. Therefore, the size (especially the height) of a workpiece 6 to be treated by the third example can be greater than that of a workpiece to be treated by the conventional sputtering devices or the first and second examples described before.

Similarly as in the first and second examples, the sputtering device shown in FIG. 3 is also advantageous in that sputtering can be achieved at high efficiency even in a gas atmosphere of extremely low pressure, and a fine metallic film is deposited on a workpiece.

Figure 6:
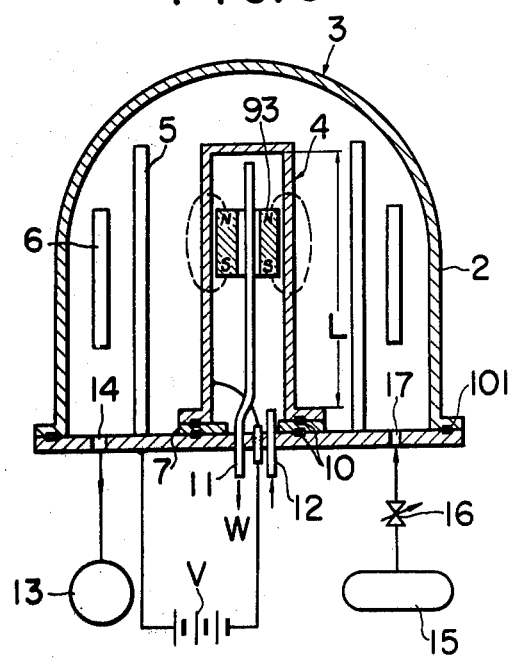
FIG. 6 is a vertical sectional view illustrating a fourth example of the sputtering device according to the invention.

A fourth example of a sputtering device according to this invention, as shown in FIG. 6, is similar in construction to that shown in FIG. 1(*a*) except that a magnet 93 provided in the target 4 is moved along the axis of the target 4 so as to obtain uniformity in thickness of a metallic film deposited on a workpiece 6 and also uniformity in consumption of the target 4 (or 41) in the electrode space.

Figure 7:
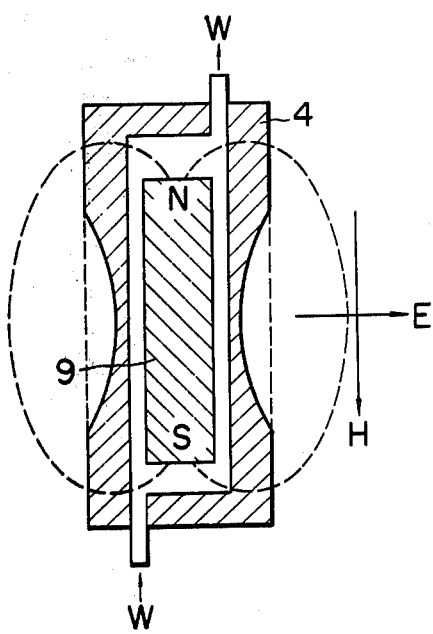
FIG. 7 is a vertical sectional enlarged view showing the erosion profile of a target incorporating a magnet, as shown in FIGS. 1(a) and 1(b).

In the sputtering device shown in FIGS. 1(*a*) and 1(*b*), the portion of the target 4 where the magnet is provided is the sputtering source. If it is assumed that the electric power applied to the sputtering device is constant, the rate of sputtering of the target 4 is proportional to the strength of the magnetic field H and to the perpendicularity of the magnetic field H with the electric field E (or how close the angle formed by the magnetic and electric fields is to 90°) on the surface of the target. Therefore, the consumption of the target 4 due to the sputtering, as shown in FIG. 7, is concentrated at the central portion of the target where the center of the magnet 9 is positioned, that is, the central portion of the target is decayed. The more the sputtering advances, the more the consumption is increased. Thus, the central portion of the target 4 is consumed sooner than the other portion. Therefore, it is necessary to replace the target 4 when the central portion of the target material has been consumed. Otherwise, the sputtering rate is decreased, which leads to lowering the efficiency of the sputtering device.

Accordingly, the service life of the target 4 is short in this sputtering device. This is considerably uneconomical.

Furthermore, the thickness of a metallic film formed on a workpiece 6 is greater at its portion opposite to the central portion of the target which has been most deeply decayed by sputtering than the other portion (FIG. 4). Therefore, it is impossible to deposit a metallic film uniform in thickness on the workpiece by the use of the sputtering device shown in FIG. 1(*a*).

The sputtering device shown in FIG. 6 is designed to overcome the above-described difficulty accompanying the sputtering device of FIG. 1(*a*).

In the sputtering device (FIG. 6), the length of the magnet 93 is shorter than the length L of the target 4, and this magnet 93 is moved vertically, or along the target 4, by means such as a manual operation, a motor-operated mechanism, or a hydraulic mechanism.

In the sputtering device thus described, during sputtering the magnet 93 is moved at least half a reciprocating distance along the target 4 with the progress of the sputtering. Accordingly, as the magnet 93 is moved in this way, the portion of the target 4 where the sputtering is effected most is also moved. As a result, the surface of the target 4 is uniformly consumed, and therefore a metallic film uniform in thickness is deposited on a workpiece 6.

In the sputtering device shown in FIG. 6, the phenomenon that the target is locally sputtered as in the case of the conventional sputtering devices, or the first and second examples of the invention is not observed, that is, the target is uniformly consumed, and accordingly, the target can be effectively and economically used. Moreover, the thickness of a metallic film deposited on a workpiece is uniform.

Thus, with the sputtering device shown in FIG. 6, the deposition of metal film can be achieved economically with good results. This sputtering device is suitable for depositing a metallic film on a relatively long workpiece.

Furthermore, since the magnet 93 is movable as described, that is, the distribution of the magnetic field in the electrode space is controlled, sputtering can be effected at a desired portion of the target, that is, the distribution in thickness of a metallic film on a workpiece can be controlled as desired.

What is claimed is:

1. A sputtering device adapted to form a metallic film on a surface of a workpiece, said device comprising a container having a plurality of anodes circumferentially surrounding a cathode, said anodes and said cathode adapted to form an electric field therebetween, and a permanent magnet disposed within said cathode such that when said device is activated the magnetic field of said magnet is orthogonal to said electric field, and magnetic force lines from said magnet form closed loops on said cathode.

2. A sputtering device according to claim 1 wherein said cathode and said magnetic each have a generally cylindrical configuration, said magnet further having a hole extending axially therethrough.

3. A sputtering device according to claim 1 wherein said device includes a cooling system for cooling said cathode, said cooling system having a liquid input and a liquid outlet coupled to said device adjacent said cathode.

4. A sputtering device according to claim 1 wherein said device includes vacuum means for forming a vacuum in said container, and a gas input means for supplying said container with a predetermined gas.

5. A sputtering device according to claim 1 wherein the outer surface of said cathode is adapted to contain a target material, said target material forming said metallic film on said workpiece upon activation of said device.

6. A sputtering device according to claim 5 wherein said device further includes a power supply adapted to activate said device, whereby cathode sputtering is achieved.

7. A sputtering device according to claim 1 wherein said magnet is formed of a plurality of cylindrical magnets.

8. A sputtering device adapted to form a metallic film on a surface of a workpiece, said device comprising a container having a workpiece holder disposed therein and a plurality of rod-like anodes circumferentially surrounding said workpiece holder, a hollow cylindrical cathode formed of inner and outer walls providing an annular space therebetween, said cathode circumferentially surrounding said plurality of anodes, said anodes and said cathode adapted to form an electric field therebetween, and an annular-shaped magnet disposed within said annular space adjacent said inner wall.

9. A sputtering device according to claim 8 wherein a cooling system is coupled to said device, said cooling system selectively circulating a fluid in said annular space.

10. A sputtering device according to claim 9 wherein said cooling system includes a fluid inlet and a fluid outlet, said inlet and said outlet extending through said container and coupled to said cathode.

11. A sputtering device according to claim 9 wherein said device includes vacuum means for forming a vacuum in said container, and a gas input means for supplying said container with a predetermined gas.

12. A sputtering device according to claim 9 wherein the outer surface of said cathode is adapted to contain a target material, said target material adapted to form said metallic film on said workpiece upon activation of said device.

13. A sputtering device according to claim 12 wherein said device further includes a power supply adapted to activate said device, whereby cathode sputtering is achieved.

14. A sputtering device adapted to form a metallic film on a surface of a workpiece, said device comprising a container having an anode and a cathode arranged in a generally coaxial configuration with said cathode surrounded by said anode, said anode and said cathode adapted to form an electric field thereinbetween, and a magnet axially disposed within said cathode such that when said device is activated the magnetic field of said magnet is orthogonal to said electric field, and magnetic force lines from said magnet form closed loops on said cathode, said workpiece being disposed in said device with said anode between said workpiece and said cathode.

15. A sputtering device adapted to form a metallic film on a surface of a workpiece, said device comprising a container having an anode and a cathode arranged in a generally coaxial configuration with said cathode surrounded by said anode, said anode and said cathode adapted to form an electric field thereinbetween, and a magnet axially disposed within said cathode such that when said device is activated the magnetic field of said magnet is orthogonal to said electric field, and magnetic force lines from said magnet form closed loops on said cathode, said magnet being slideably disposed within said cathode.

16. In a cathode sputtering apparatus comprising:
 (a) cathode means adapted to support a sputtering target having a face of material to be sputtered;
 (b) magnetic field means adjacent said cathode means on the side thereof opposite from said face, said magnetic field means adapted to develop magnetic lines of force, at least some of which define arcuate paths which enter and leave said face at spaced-apart intersection therewith, said lines of force tending to generate non-uniform erosion of said sputtered face;
 (c) the improvement comprising means for generating substantially continuous relative motion between said face and said magnetic field means to ensure substantially uniform removal of sputtered material over at least a portion of said face.

* * * * *